United States Patent [19]

Guglielmi et al.

[11] Patent Number: 5,299,231
[45] Date of Patent: Mar. 29, 1994

[54] METHOD AND DEVICE FOR ESTIMATING THE CARRIER FREQUENCY OF A MODULATED DATA SIGNAL

[75] Inventors: Franco Guglielmi, Milan; Arnaldo Spalvieri, Senigallia, both of Italy

[73] Assignee: Alcatel Italia SpA, Milan, Italy

[21] Appl. No.: 810,217

[22] Filed: Dec. 19, 1991

[30] Foreign Application Priority Data

Dec. 19, 1990 [IT] Italy ............... 22444/A90

[51] Int. Cl.$^5$ ............................... H04L 27/22
[52] U.S. Cl. .................................. 375/97; 375/83; 329/306
[58] Field of Search ............ 375/97, 78, 83, 99, 375/102; 329/304, 306, 327; 455/257, 263

[56] References Cited

U.S. PATENT DOCUMENTS

| | | | |
|---|---|---|---|
| 4,328,587 | 5/1982 | Mizuno et al. | 375/97 |
| 4,611,165 | 9/1986 | Nussbaum | 324/77 B |
| 4,712,221 | 12/1987 | Pearce et al. | 375/97 X |
| 4,761,604 | 8/1988 | Engelson et al. | 324/78 R |
| 4,904,930 | 2/1990 | Nicholas | 324/77 E |
| 4,951,219 | 8/1990 | Zimmer | 364/484 |
| 4,958,360 | 9/1990 | Sari | 375/97 |
| 4,977,580 | 12/1990 | McNicol | 375/97 |
| 5,019,823 | 5/1991 | Bream et al. | 342/175 |
| 5,049,830 | 9/1991 | Yoshida | 375/97 X |

*Primary Examiner*—Curtis Kuntz
*Assistant Examiner*—Bryan E. Webster
*Attorney, Agent, or Firm*—Ostrolenk, Faber, Gerb & Soffen

[57] ABSTRACT

A method of estimating the carrier frequency of a numeric signal, in which two estimates of the carrier phase are carried out in successive instants of time and the estimated carrier frequency is obtained from the comparison of the above two estimates. The invention also concerns a device for implementing the method, the device including a circuit for estimating the phase of the signal at successive instants in time, a circuit for storing the estimates, and a circuit for comparing the estimates. In a preferred embodiment, both the phase estimator and the comparison circuit are implemented by multipliers and adders.

5 Claims, 2 Drawing Sheets

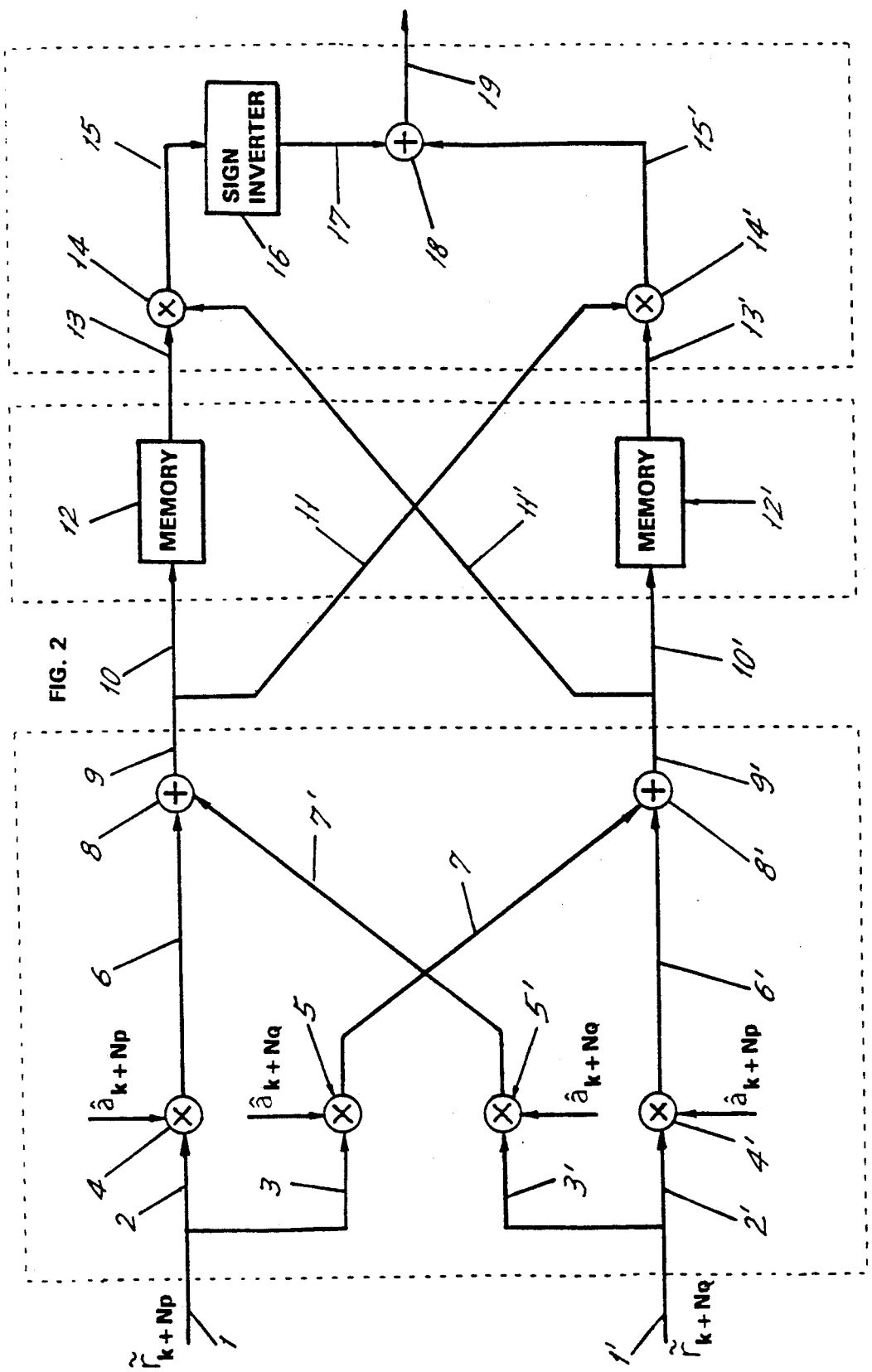

METHOD AND DEVICE FOR ESTIMATING THE CARRIER FREQUENCY OF A MODULATED DATA SIGNAL

BACKGROUND OF THE INVENTION

Field of the Invention

The present invention relates to a method for estimating the carrier frequency of a numeric signal in particular, QAM or PSK modulated signals.

Description of the Related Art

In conventional data transmission systems, various estimators of the carrier frequency are used. These estimators have the common disadvantageous feature of operating correctly only when the spectral power density associated with the signal has an even symmetry with respect to the carrier frequency. This disadvantageous feature stems from the fact that all known estimators make an estimate of the spectrum centroid. When the spectrum is non-symmetrical, its centroid does not coincide with the carrier frequency and conventional systems make an incorrect estimate.

In radio link transmission, unfavorable propagation phenomena, in particular so-called "selective fading", causes dyssmmetries in the spectrum, making conventional estimators unusable.

The conventional technique used in radio links consists of generating an estimate of the carrier that changes periodically in the frequency interval in which the signal carrier a priori is supposed to reside.

When the estimated carrier frequency is equal to the signal carrier frequency, a suitable detector indicates the correctness of the estimate by interrupting the periodic variation of the estimate itself.

Such a technique is difficult to implement; moreover, in conventional systems, in order to obtain satisfactory operation of said detector, it is necessary to maintain a low rate of the estimate variation, thus slowing down the process of recognizing the signal carrier frequency.

SUMMARY OF THE INVENTION

A first object of the invention is to provide a method of estimating the carrier frequency which does not have the above-mentioned drawbacks and, in particular, is unaffected by asymmetries in the signal power spectral density.

Another object is to provide a circuitry that is simple and effective for implementing such a method.

The above-noted objectives are achieved in the invention by a solution which is based upon the estimate of phase $\phi_k$ in the kth signaling interval.

If $r_k$ is the received complex signal at the kth signaling interval, it may be expressed by equation (I):

$$r_k = (a_k + d_k) e^{j\phi_k} \quad (I)$$

where $a_k$ is the complex data transmitted at kth signaling interval, and $d_k$ is the complex disturbance overlapped to the data and inclusive of noise, interference from other transmissions and intersymbol interference.

If $\hat{a}_k$ is the complex data estimated by the receiver at $r_k$, an estimate of the terms $e^{j\phi_k}$, designated with $\hat{e^{j\phi}}k$, is obtainable through equation (II):

$$\hat{e^{j\phi}}k = r_k \overline{\hat{a}_k} \quad (II)$$

where $\overline{\hat{a}_k}$ denotes the complex conjugate of the estimated data $\hat{a}_k$.

According to the invention, the estimate $\hat{e^{j\phi}}k$ is stored, while the phase estimator goes on in producing the estimate relative to the successive signaling intervals.

After N signaling intervals, the estimate $\hat{e^{j\phi}}k+N$ will be also available.

Since the carrier frequency is defined as the derivative of the carrier phase with respect to time, an approximation of the frequency is obtainable by calculating the difference between two phases extracted at successive times k and k+N.

Operatively, such difference is realized by multiplying the term relative to the (k+N)th interval with the complex conjugate of the term relative to kth interval and taking only the imaginary part of the product as indicated in equation (III):

$$f_{k+N} = Im \{\hat{e^{j\phi}}k+N \, e^{-j\hat{\phi}k}\} \quad (III)$$

where $f_{k+N}$ denotes the frequency estimate at the (k+N)th interval, while Im denotes the imaginary part.

BRIEF DESCRIPTION OF THE DRAWINGS

FIG. 2 is a schematic of the preferred embodiment of the invention.

DETAILED DESCRIPTION OF THE PREFERRED EMBODIMENT

Figure 1:
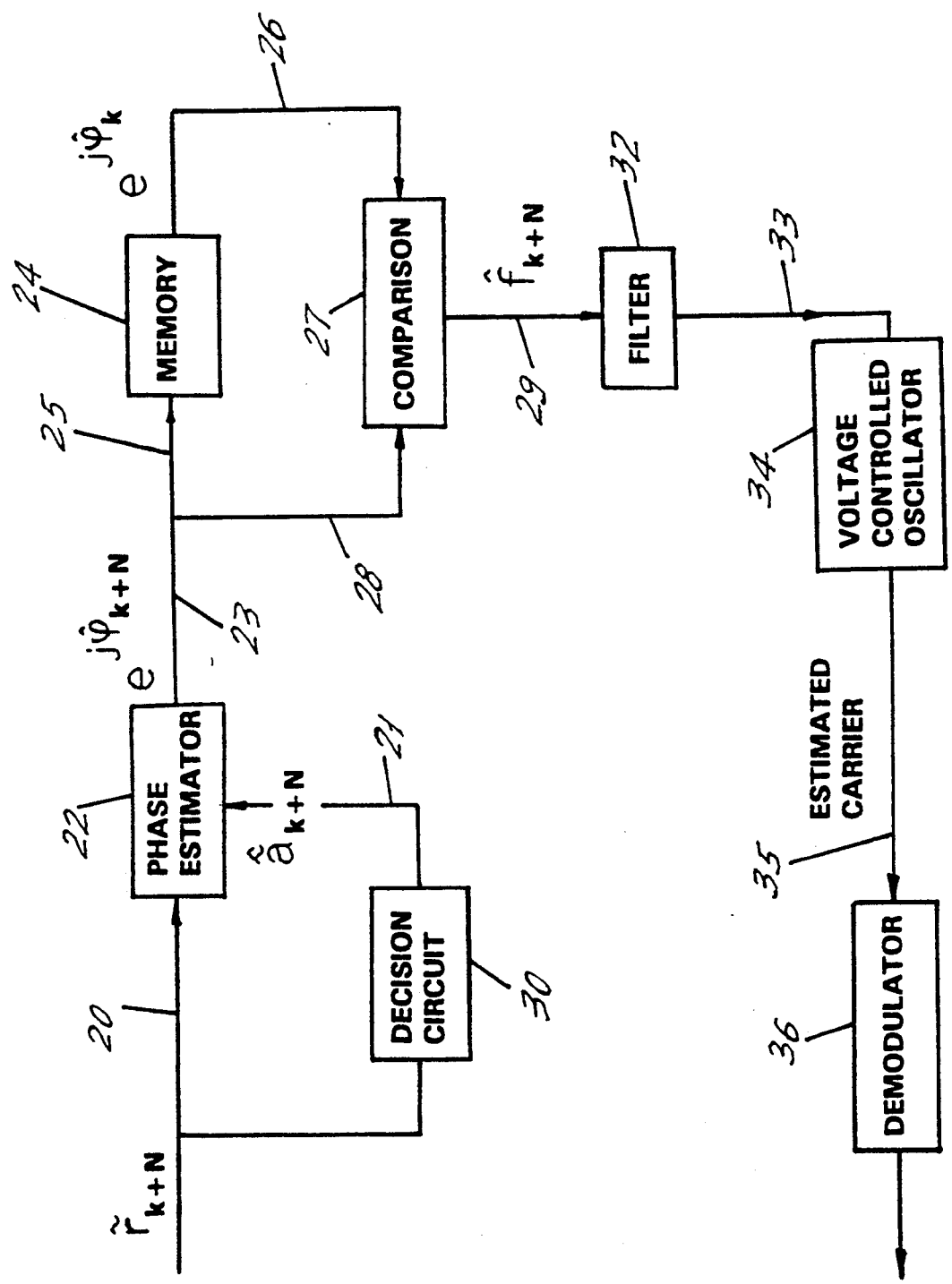
FIG. 1 is a block diagram of the hardware for implementing the estimation process of the present invention.

The process of the $f_{k+N}$ estimate processing of the invention is illustrated in the schematic block diagram of FIG. 1 which shows:

a phase estimator device identified by reference symbol 22: at signaling instant k+N, estimator 22 has at its input the complex signal (on line 20) and the complex data $\hat{a}_{k+N}$ estimated in decision circuit 30 of the received (line 21) and provides the output $\hat{e^{j\phi}}k+N$ (line 23) by operating in accordance with equation II (at signal instant k+N)

a storage device (block NT, identified by reference symbol 24) which stores the phase estimate $\hat{e^{j\phi}}k+N$ at its input (line 25) and provides at its output the estimate $\hat{e^{j\phi}}k$ processed by phase estimator at the previous signaling instant k (line 26).

a comparison device (block CFR, identified by reference symbol 27) which receives at its input two estimates $\hat{e^{j\phi}}k$ (line 26) and $\hat{e^{j\phi}}k+N$ (line 28) and generates the frequency estimate $f_{k+N}$ (line 29) by operating in accordance with equation III.

The frequency estimate obtained in accordance with the invention on line 29 is applied to conventional circuitry of the receiver consisting substantially of a filter F (32) which feeds, through line 33, the generator VCO (34) of the estimated carrier PS which, on line 35, is applied to demodulator DEM (36) of the receiver.

In a particularly advantageous embodiment of the invention, the circuit for implementing the method of the invention substantially comprises: four multipliers and two adders for carrying out the complex product of equation II, a storage circuit, two multipliers and an adder for carrying out the operation of equation III.

Various features and advantages of the invention will be more apparent from the following description of an embodiment thereof as illustrated in the attached drawing (FIG. 2).

Signals $r_{k+N,p}$ and $r_{k+N,q}$ represent, respectively, the real part and the imaginary part of the complex signal $r_{k+N}$.

Blocks marked with an "x" (4, 5, 14 and 4', 5'14') represent multiplier circuits; blocks marked with a "+" (8, 8', 18) represent adder circuits; blocks marked with NT (12, 12") represent memories designed to produce a delay of N signaling intervals; the block marked with "+/−" (16) represents a sign change.

As can be seen in FIG. 2, signals $r_{k+N,p}$ and $r_{k+N,q}$ go through analogous processes, respectively, marked by numerals without apex and numerals with apex.

Signal $r_{k+N,p}$ is applied to line 1 and, through lines 2 and 3, respectively, fed to a multiplier 4 and to multiplier 5.

Also fed to the input of multiplier 4 is the signal $k_{k+N,p}$, which represents the real part of the complex signal.

Also fed to the input of multiplier 5 is the signal $a_{k+N,q}$, which represents the imaginary part of the complex signal $a_{k+N}$.

Similarly, signal $r_{k+N,q}$ is applied to line 1' and, through lines 2' and 3', is fed, respectively, to multiplier 4' and multiplier 5.

Also fed to the input of multiplier 4' is signal $a_{k+N,p}$, while signal $a_{k+N,q}$ with its sign reversed is fed to the input of multiplier 5'.

The outputs of multiplier 4 and multiplier 5' are fed to the inputs of adder 8, through line 6 and line 7', respectively.

The output of adder 8, connected to line 9, is applied simultaneously to delay block 12 (through line 10) and to multiplier 14' (through line 11).

Reciprocally, the output of adder 8' connected to line 9', is simultaneously fed to delay block 12' (through line 10') and to multiplier 14 (through line 11').

The output of delay blocks 12 and 12' is fed, respectively, to multipliers 14 and 14' through lines 13 and 13'.

Through line 15, the output of multiplier 14 is fed to sign change block 16, whose output is fed to adder 18 through line 17.

Through line 15, the output of multiplier 14, is fed to adder 18.

The output of adder 18 is the frequency estimate $f_{k+N}$ and is outputted through line 19.

All of the elements of the circuit in FIG. 1 can be readily implemented with components available on the market, such as MOS, HCMOS logic, analog circuits and so on, as will be apparent to those of skill in this art.

Obviously, the method according to the schematic illustrated in FIG. 1 and the preferred embodiment shown in FIG. 2 are susceptible to modifications and variations which, being evident even to those not very skilled in the art, are to be considered as falling within the sphere of the inventive concept.

We claim:

1. A method of estimating the carrier frequency of a modulated data signal, comprising the steps of:
   estimating the phase of the signal at two instants in time, said instants being N signal intervals apart, where N is a number of signal intervals; and
   calculating the difference between the two estimates wherein:
   (a) a first phase estimate of the signal is made at a kth signal interval, in accordance with the equation:

$$e^{j\phi k} = r_k a_k^*;$$

where $r_k$ is the composite complex signal, comprising complex signal data and noise, at the kth signal interval, and $a_k^*$ is the complex conjugate of the signal data at the kth signal interval;

(b) a second phase estimate of the signal is made at a (k+N)th signal interval, in accordance with the equation:

$$e^{j\phi k+N} = r_{k+N} a_{k+N}^*$$

and where $r_{k+N}$ is the composite complex signal, comprising complex signal data and noise, at the (k+N)th signal interval, and $a_{k+N}^*$ is the complex conjugate of the signal data at the (k+N)th signal interval; and (c) the difference between the two estimates is calculated in accordance with the equation:

$$f_{k+N} = Im\{e^{j\phi k+N} e^{-j\phi k}\}$$

where $f_{k+N}$ is an estimate of the carrier frequency of the signal at the (k+N)th signal interval, and Im is the imaginary part of the product $e^{j\phi k+N} e^{-j\phi k}$.

2. A device for estimating the carrier frequency of a modulated data signal, comprising:
   (a) a circuit for estimating the phase of the signal at:
     (i) a kth signal interval, in accordance with the equation:

$$e^{j\phi k} = r_k a_k^*;$$

where
k is a selected signal interval,
$r_k$ is the composite complex signal, comprising complex signal data and noise, at the kth signal interval, and
$a_k^*$ is the complex conjugate of the signal data at the kth signal interval; and (ii) at a (k+N)th signal interval, in accordance with the equation:

$$e^{j\phi k+N} = r_{k+N} a_{k+N}^*$$

and where
N is a selected number of intervals,
$r_{k+N}$ is the composite complex signal, comprising complex signal data and noise, at the (k+N)th signal interval, and
$a_{k+N}^*$ is the complex conjugate of the signal data at the (k+N)th signal interval;

(b) a circuit for storing the phase estimates of the signal at the kth signal interval; and (c) a circuit for calculating the difference between the phase estimate at the (k+N)th signal interval and the stored phase estimate at the kth signal interval in accordance with the equation:

$$f_{k+N} = Im\{e^{j\phi k+N} e^{-j\phi k}\}$$

where $f_{k+N}$ is an estimate of the carrier frequency of the signal at the (k+N)th signal interval, and Im is the imaginary part of the product $e^{j\phi k+N} e^{-j\phi k}$.

3. A device as recited in claim 2, wherein the circuit for estimating the phase of the signal comprises:

a multiplier for multiplying the real part of $r_{k+N}$ with the real part of $a_{k+N}$ to generate a first product;

a multiplier for multiplying the real part of $r_{k+N}$ with the imaginary part of $a_{k+N}$ to generate a second product;

a multiplier for multiplying the imaginary part of $r_{k+N}$ with the real part of $a_{k+N}$ to generate a third product;

a multiplier for multiplying the imaginary part of $r_{k+N}$ with the imaginary part of $a_{k+N}$ to generate a fourth product;

a first adder for adding the first and fourth products; and a second adder for adding the second and third products.

4. A device as recited in claim 3, wherein the circuit for storing the phase estimates of the signal comprises a two memories, each of which generates a delay of N signal intervals.

5. A device as recited in claim 4, wherein the circuit for calculating the difference between the two stored phase estimates comprises:

a fifth multiplier for multiplying the output of a first one of the two memories with the first adder;

a sixth multiplier for multiplying the output of a second one of the two memories with the second adder;

a sign inverter for inverting the output of the sixth multiplier; and a third adder for adding the output of the fifth multiplier and the output of the sign inverter.

* * * * *